United States Patent
Maier

(10) Patent No.: US 6,176,153 B1
(45) Date of Patent: Jan. 23, 2001

(54) PROCESS FOR MANUFACTURING AN EXTRUSION TOOL USING A CVD PROCESS

(75) Inventor: Bruno Maier, Rielasingen-Worblingen (DE)

(73) Assignee: WEFA Werkzeugfabrik Singen GmbH, Singen (DE)

( * ) Notice: Under 35 U.S.C. 154(b), the term of this patent shall be extended for 0 days.

(21) Appl. No.: 09/194,337

(22) PCT Filed: Sep. 10, 1998

(86) PCT No.: PCT/EP98/05762

§ 371 Date: Nov. 24, 1998

§ 102(e) Date: Nov. 24, 1998

(87) PCT Pub. No.: WO99/12671

PCT Pub. Date: Mar. 18, 1999

(30) Foreign Application Priority Data

Sep. 10, 1997 (DE) ................................ 197 39 631
Feb. 12, 1998 (DE) ................................ 198 05 746
Mar. 9, 1998 (DE) ................................ 198 10 015

(51) Int. Cl.[7] .................................................. B21C 25/10
(52) U.S. Cl. .......................... 76/107.1; 72/467; 427/249; 427/318
(58) Field of Search ..................... 76/107.1, 467; 427/249, 248.1, 318, 372.2

(56) References Cited

U.S. PATENT DOCUMENTS

| | | | | |
|---|---|---|---|---|
| 3,895,899 | * | 7/1975 | Weber | 425/378 R |
| 4,574,459 | * | 3/1986 | Peters | 76/107.1 |
| 5,093,151 | * | 3/1992 | Van Den Berg | 427/249 |
| 5,328,513 | * | 7/1994 | Suzuki | 427/248.1 |
| 5,587,233 | * | 12/1996 | Konig | 427/318 |
| 5,858,463 | * | 1/1999 | Ogura | 427/249 |

FOREIGN PATENT DOCUMENTS

1542856 * 3/1979 (GB) .

* cited by examiner

*Primary Examiner*—Daniel C. Crane
(74) *Attorney, Agent, or Firm*—Bachman & LaPointe, P.C.

(57) ABSTRACT

In an extrusion tool—in particular a disk-shaped pressing die with at least one shaping opening for the extrusion of metal such as aluminum or an aluminum alloy—comprising a steel material—in particular a low-distortion hot-working steel—with a surface coating, the coating on the extrusion tool is made from coating material which is selected from the group containing carbides, nitrides, oxides and combinations of those substances, wherein the coating material is applied to the extrusion tool by a CVD-process.

10 Claims, 1 Drawing Sheet

PROCESS FOR MANUFACTURING AN EXTRUSION TOOL USING A CVD PROCESS

Figure 1:
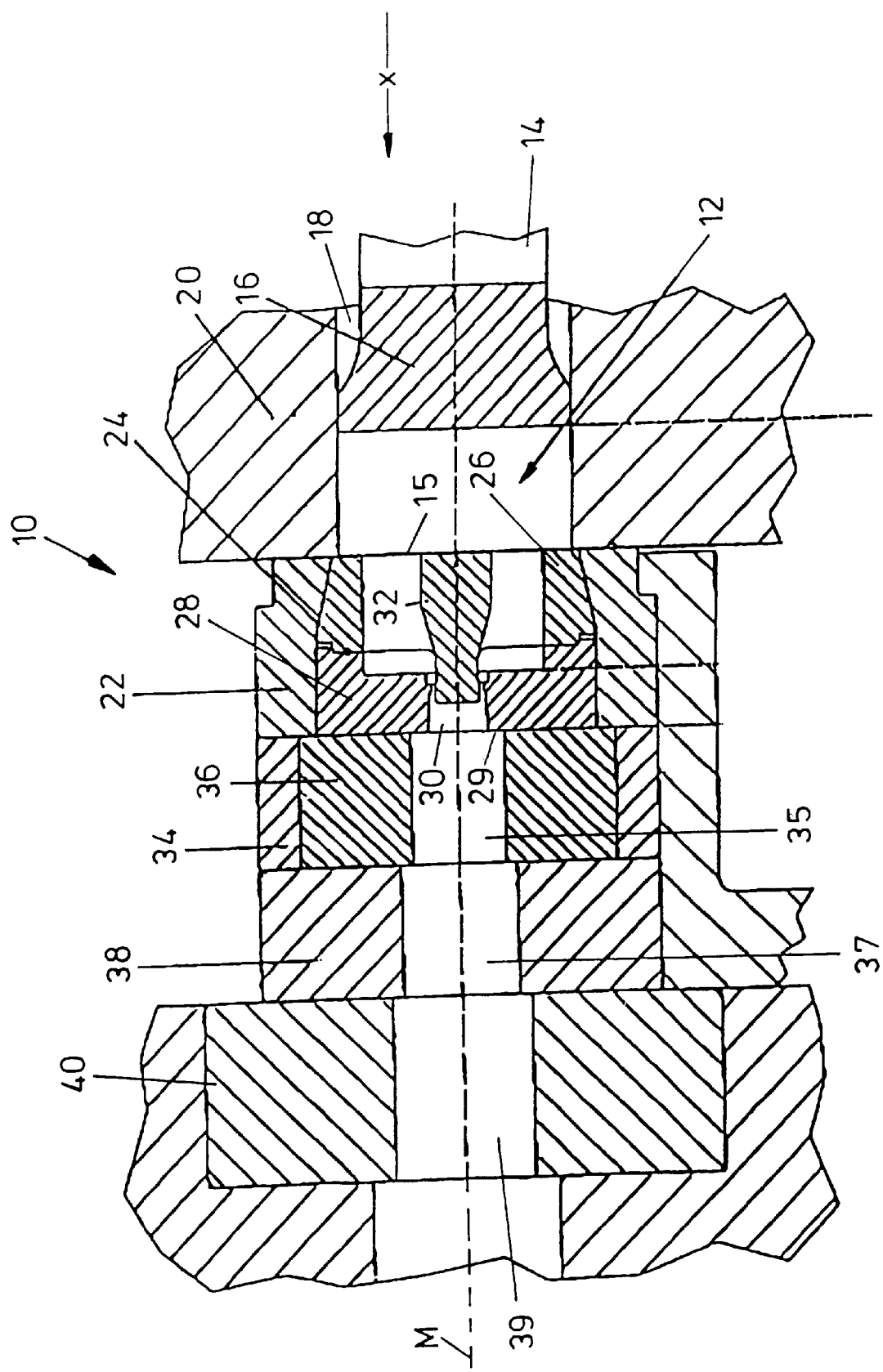

This application is a 371 of PCT/EP98/05762, filed Sep. 10, 1998.

The present invention concerns an extrusion tool—in particular a disk-shaped pressing or extrusion die with at least one shaping opening for the extrusion of metal such as aluminum or an aluminum alloy—comprising a steel material with a surface coating. The invention also concerns a process for the production of an extrusion tool of that kind, and the use thereof.

The hardness of conventional pressing tools—which are used for example for the production of shaped aluminum parts—is often not adequate for industrial use in order to achieve satisfactory resistance to wear and thus economically meaningful service lives. For that reason such extrusion tools are hardened using known hardening processes.

Extrusion tools produced from hot-machining steels are more commonly hardened after machining production thereof to between about 46 and 50 HRC and are then finished by grinding, cavity sinking by EDM and wire-EDM; the tool is then usually subjected to a trial in the aluminum pressing machine and—if necessary—a correction is made. If then an extrusion tool is ready for the extrusion operation, it is set to a surface hardness of about 1000 VH in the prescribed manner by nitriding; practice has shown that this hardness value affords adequate resistance to wear, in use in a practical context.

The known nitriding processes include salt bath nitriding using cyanide salts. That process however involves serious environmental problems so that the industrial future thereof is doubtful. Nitriding by means of a gas suffers from the disadvantage that the hardening layer produced is relatively thick and as a result has only a limited level of toughness. Finally there is the possibility of plasma nitriding, but that process is not suitable in particular for tools with thin slots as the openings therethrough.

The known hardening processes involving nitriding also suffer from the common disadvantage that the hardening layer diffuses away with increasing temperature; at a temperature of about 500° C. for example a layer which is produced by salt bath nitriding is no longer present after about fifteen hours.

If then in a pressing operation the nitriding layer has disappeared due to the effect of diffusion, the pressing operation has to be interrupted; the tool is pickled free, cleaned and re-nitrided. With frequent post-nitriding near the tempering temperature of the steel used, its hardness and basic strength also continuously decrease, and that results in premature failure. Thus for example in the case of thin-walled tools, the service life which can be achieved is only between about 30 and 100 pressing operations before renewed post-nitriding, with its attendant cost disadvantage, becomes necessary.

In consideration of that state of the art the inventor set himself the aim of providing an extrusion tool which not only affords effective durable protection from wear—and accordingly a markedly increased service life—but also involves good suitability in particular for thin-wall tools. The invention seeks to provide that the production process can be implemented in a simple fashion and without environmental pollution.

In accordance with the invention the coating of the extrusion tool is made from a coating material which is selected from the group containing titanium carbide, titanium nitride, titanium boride, vanadium carbide, chromium carbide, aluminum oxide, silicon nitride and combinations thereof; that coating material has been applied by a CVD-gas deposition process—preferably at temperatures over 1000° C.—to the surface of the extrusion tool whose base material is in particular a low-distortion hot-working steel.

A process having the following steps is also in accordance with the invention cutting shaping of the extrusion tool from a steel material in the desired configuration;

hardening and final machining of the extrusion tool;

coating the shaped steel material at predetermined locations with at least one above-mentioned coating material by means of the so-called CVD-process; and hardening the coated steel material.

The thermally activated CVD-process—Chemical Vapor Deposition—is known per se for the production of single crystals, the impregnation of fiber structures with carbon or ceramics and generally for the deposition of thin layers—either by growth onto a surface or by the diffusion of borides, carbides, nitrides, oxides.

The procedure in accordance with the invention results in a wear-resistant layer for the extrusion tool, which outlasts the service life of the tool itself, without further post-treatments. That surprising property is afforded by virtue of the coating which is applied by the CVD-process and which is applied at temperatures of preferably more than 1000° C.; advantageously in that respect the invention comes in above the conventional hardening processes which basically remain below temperatures of between about 500 and 600° C.—that is to say the tempering limit of the steel material used.

Admittedly, CVD-coating requires hardening of the finished tool after the coating operation; however by accurately controlling the flow phenomena in the tools and the selection in accordance with the invention of in particular low-distortion hot-working steels to carry the invention into effect, that technology can be managed in a surprising and unforeseeable manner and affords outstanding properties in terms of hardness and resistance to wear.

As already mentioned above, in an advantageous development of the invention, in particular titanium carbide, titanium nitride, titanium boride, vanadium carbide, chromium carbide, aluminum oxide and silicon nitride are suitable for the coating; depending on the material involved, it is possible to achieve microhardness levels of between VH=about 2000 and VH=about 4000. In particular titanium carbide or aluminum oxide—applied by means of the CVD-process—have outstanding toughness properties while for example chromium carbide is particularly resistant to abrasive wear and less susceptible to cracks or pores. In particular also titanium carbide is additionally distinguished by advantageous frictional properties.

The CVD-coating process which is used in accordance with the invention, namely direct deposition of the stated solid materials out of the gaseous phase affords the present field of use of the extrusion dies numerous advantages which besides resistance to wear—that is to say a long service life—afford hardness and toughness:

accurate and uniform and regular coating, even on tools of complicated shape; due to the scatter capability inherent in CVD-procedures it is possible in particular to apply a uniform regular coating with a high degree of accuracy;

advantageous ratio of defect rates and tools quality, in the production and coating of the extrusion die in accordance with the invention, the CVD-process which can be well-managed affords considerably procedural reliability and good reproducibility, so that it is possible to produce tools of extremely high-grade quality, with a very low level of rejects; and high layer adhesion; a very good bond is produced between the base material and the coating by the CVD-process, by virtue of the metallurgical character of the bond.

Preferably the starting materials used for the production of the extrusion die according to the invention are tough steels with good high-temperature characteristics and which are alloyed for example with Cr, Mo or with tungsten and which are melted for example by ESR (Electro-Slag Remelting) for a high level of toughness.

The above-mentioned coating materials, any combinations thereof, even in a multi-layer structure, or however alternative suitable materials, are then deposited by means of a CVD-process at temperatures of between about 700 and about 1050° C. for a period of between 5 and 6 hours.

The tool produced in that way is hardened again after that coating procedure.

The steel alloy used is preferably so selected that no substantial distortion or deformation occurs due to the rise in temperature which is connected to the CVD-coating process. In addition, it is to be deemed part of the present invention that any distortion or deformation is already incorporated in the design of the tool on the basis of the expected flow characteristics of the material.

A similar consideration applies in regard to the actual extrusion operation—for example in respect of shaped aluminum parts—using a tool of that kind which is produced in accordance with the invention. Here the invention is to be deemed also to include the consideration that the flow characteristics of the aluminum are also taken into account and as such are entailed in the design configuration and hardening of the extrusion die. In that respect it is particularly preferable to take account of those flow characteristics by way of preceding simulation computation.

As a result, that then not only provides for a considerably increased service life; maintenance of the tools, as described in the opening part of this specification, is also practically no longer necessary. In addition, a lower level of friction is advantageously achieved by virtue of the coating materials which are applied by means of the CVD-process according to the invention, whereby the processing or pressing speed of the extrusion die is enhanced and better shaped part quality is possible.

Further advantages, features and details of the invention will be apparent from the description hereinafter of a preferred embodiment and with reference to the drawing in which the single Figure is a diagrammatic view in longitudinal section through an apparatus 10 for the extrusion of shaped parts.

An installation for processing a pressing billet 12 of light metal or alloy—in particular an aluminum alloy—has, at a press which is otherwise not illustrated, a pressing ram 14 with a pressing disk 16 which is pushed in the pressing direction x into the pressing passage 18 of a container or receiving means 20.

At the mouth opening 15 of the pressing passage 14, which is remote from the pressing ram, disposed in a tool holder 22 is a chamber-type tool 24 with a tool collar 26 and a—substantially disk-shaped—die 28 which adjoins it in the pressing direction x. The die includes a central shaping opening 30 which is arranged on the longitudinal axis M of the apparatus 10 and which receives the free end of a mandrel or bar portion 32.

Adjoining the free face 29 of the die in the pressing direction x is an intermediate ring 36 which is surrounded by a peripheral ring 34 and between which and a transverse member 40 is a pressure plate 38. The extrusion which is produced in the shaping opening 30 but which is not illustrated in the drawing is withdrawn through central openings 35, 37, 39 in the intermediate ring 36, the pressure plate 38 and the transverse member 40.

The tool 24, 28, 32 is formed from a low-distortion hot-working steel and—after the cutting machining thereof—provided with a wearing layer which cannot be seen in the drawing; that is effected by the per se known (Chemical Vapor Deposition) CVD-process at over 1000° C. The tool 24, 28, 32 is heated for the coating operation to about 1000° C. and is then coated with titanium, vanadium or chromium carbide, with aluminum oxide, titanium or silicon nitride.

Chemical reactions are identified as CVD-reactions, in which the starting products are present in the form of gases or vapors, the main product is separated out in the form of a solid body, and the by-products are gaseous. Set out by way of example here is the gross reaction equation for titanium nitride in accordance with the high-temperature CVD-process, wherein (g)=gaseous and (s)=solid:

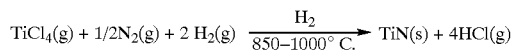

In that case the reducing carrier gas (H$_2$) is added in excess.

That is then followed by hardening of the base material, namely quenching of the tool steel and tempering thereof in order to achieve high hardness.

What is claimed is:
1. A process for producing an extrusion tool for the extrusion of metal, comprising the following steps:
   cut shaping of the extrusion tool from a steel material;
   hardening and final machining of the extrusion tool;
   coating of the shaped steel material at predetermined locations with at least one carbidic, nitridic and/or oxidic coating material by means of a CVD-process wherein the CVD-process is carried out at a temperature of between 700° C. and 1050° C., for a period of between 5 and 6 hours; and
   hardening the coated steel material.
2. A process as set forth in claim 1 wherein the coating material is selected from the group consisting of titanium, vanadium, chromium carbide and mixtures thereof.
3. A process as set forth in claim 1 wherein the coating material is selected from the group consisting of titanium, silicon nitride and mixtures thereof.
4. A process as set forth in claim 1 wherein the coating material is aluminum oxide.
5. A process as set forth in claim 1 wherein the coating material is titanium boride.
6. A process for producing an extrusion tool for the extrusion of metal, comprising the following steps:
   cut shaping of the extrusion tool from a steel material;
   hardening and final machining of the extrusion tool;
   coating of the shaped steel material at predetermined locations with at least one carbidic, nitridic and/or oxidic coating material by means of a CVD-process wherein the CVD-process is carried out at a temperature of over 1000° C.; and
   hardening the coated steel material.

7. A process as set forth in claim 6 wherein the coating material is selected from the group consisting of titanium, vanadium, chromium carbide and mixtures thereof.

8. A process as set forth in claim 6 wherein the coating material is selected from the group consisting of titanium, silicon nitride and mixtures thereof.

9. A process as set forth in claim 6 wherein the coating material is aluminum oxide.

10. A process as set forth in claim 6 wherein the coating material is titanium boride.

* * * * *